United States Patent
Yamamoto et al.

(10) Patent No.: US 8,085,101 B2
(45) Date of Patent: Dec. 27, 2011

(54) SPREAD SPECTRUM CLOCK GENERATION DEVICE

(75) Inventors: Michiyo Yamamoto, Osaka (JP); Tsuyoshi Ebuchi, Osaka (JP); Kenji Murata, Osaka (JP)

(73) Assignee: Panasonic Corporation, Osaka (JP)

( * ) Notice: Subject to any disclaimer, the term of this patent is extended or adjusted under 35 U.S.C. 154(b) by 36 days.

(21) Appl. No.: 12/678,630

(22) PCT Filed: Oct. 28, 2008

(86) PCT No.: PCT/JP2008/003073
§ 371 (c)(1),
(2), (4) Date: Mar. 17, 2010

(87) PCT Pub. No.: WO2009/057289
PCT Pub. Date: May 7, 2009

(65) Prior Publication Data
US 2010/0214031 A1    Aug. 26, 2010

(30) Foreign Application Priority Data
Nov. 2, 2007    (JP) ................. 2007-286019

(51) Int. Cl.
*H03B 29/00* (2006.01)
(52) U.S. Cl. ........... 331/78; 331/16; 331/34; 331/17; 455/260; 327/156; 375/376

(58) Field of Classification Search ............ 455/260; 331/16, 34, 17, 78; 327/156; 375/376
See application file for complete search history.

(56) References Cited

U.S. PATENT DOCUMENTS

| | | | |
|---|---|---|---|
| 6,292,507 B1 | 9/2001 | Hardin et al. | |
| 7,098,709 B2 | 8/2006 | Ido et al. | |
| 7,233,215 B2 | 6/2007 | Ebuchi et al. | |
| 7,253,691 B2 | 8/2007 | Okada | |
| 2002/0017933 A1 | 2/2002 | Hayashida | |
| 2003/0160641 A1 | 8/2003 | Starr et al. | |
| 2005/0008113 A1 | 1/2005 | Kokubo et al. | |

FOREIGN PATENT DOCUMENTS

| | | |
|---|---|---|
| JP | 2-246423 | 10/1990 |
| JP | 5-175834 | 7/1993 |
| JP | 07-086933 | 3/1995 |
| JP | 7-202638 | 8/1995 |
| JP | 8-107351 | 4/1996 |
| JP | 2001-044826 | 2/2001 |
| WO | WO 2007/080719 A1 | 7/2007 |

*Primary Examiner* — Arnold Kinkead
(74) *Attorney, Agent, or Firm* — McDermott Will & Emery LLP

(57) ABSTRACT

A spread spectrum controller (20) controls a PLL (10) so that the PLL outputs a spread-spectrum processed clock signal. A loop bandwidth controller (30) controls at least one of a phase detector (11), a loop filter (12), a voltage-controlled oscillator (13), and a frequency divider (14) in the PLL (10) during operation of the spread spectrum controller (20) to change a loop bandwidth of the PLL (10).

11 Claims, 15 Drawing Sheets

(a)

EXCELLENT PEAK REDUCTION RATE BUT POOR NOISE PROPERTIES (b)

POOR PEAK REDUCTION RATE BUT EXCELLENT NOISE PROPERTIES (c)

EXCELLENT PEAK REDUCTION RATE AND EXCELLENT NOISE PROPERTIES (a)

(b)

SPREAD SPECTRUM CLOCK GENERATION DEVICE

RELATED APPLICATIONS

This application is the U.S. National Phase under 35 U.S.C. §371 of International Application No. PCT/JP2008/003073, filed on Oct. 28, 2008, which in turn claims the benefit of Japanese Application No. 2007-286019, filed on Nov. 2, 2007, the disclosures of which Applications are incorporated by reference herein.

TECHNICAL FIELD

The present invention relates to devices generating spread-spectrum processed clock signals.

BACKGROUND ART

With an increase in speed and integration of semiconductor integrated circuits, there is a problem of electromagnetic interference (EMI). In order to reduce the EMI, an increasing number of devices operate with spread-spectrum processed clock signals.

The spread-spectrum processed clock signals can be obtained by applying specific controls for spread spectrums on phase locked loops (PLLs), which generate clock signals with desired frequencies. Traditionally, an input voltage to a voltage-controlled oscillator (or an input current when a current-controlled oscillator is used) in a PLL has been modulated, or a dividing ratio of a frequency divider has been changed to generate a spread-spectrum processed clock signal (see, e.g., Patent Documents 1 and 2). Another conventional approach has been to accordingly select and output one of a plurality of clock signals output from a voltage-controlled oscillator, and having different phases or frequencies (see, e.g., Patent Document 3).

CITATION LIST

Patent Document

PATENT DOCUMENT 1: Japanese Patent Publication No. 2001-44826
PATENT DOCUMENT 2: Japanese Patent Publication No. 2000-209033
PATENT DOCUMENT 3: Japanese Patent Publication No. 2005-184488

SUMMARY OF THE INVENTION

Technical Problem

With an increase in a loop bandwidth of a PLL, a peak level of a clock signal output from the PLL is lowered. Thus, in order to reduce EMI, the loop bandwidth of the PLL is preferably formed as large as possible. However, when the loop bandwidth of the PLL is formed large, jitter and noise properties of a clock signal output from the PLL deteriorates to cause malfunction of a device. In particular, in recent large-scale system LSIs, a large noise is mixed into a reference signal and a power source. In order to reduce effects of the noise, the loop bandwidth of the PLL is preferably formed as small as possible. As such, it has become difficult to achieve reduction in EMI, and an improvement in jitter and noise properties at the same time.

In view of the above-described problems, it is an objective of the present invention to improve jitter and noise properties of a spread-spectrum processed clock signal.

SOLUTION TO THE PROBLEM

In order to achieve the above-described objective, the present invention provides a spread-spectrum clock generator including a PLL, a spread spectrum controller controlling the PLL so that the PLL outputs a spread-spectrum processed clock signal, and a loop bandwidth controller changing a loop bandwidth of the PLL during operation of the spread spectrum controller. This configuration can change the loop bandwidth of the PLL outputting the spread-spectrum processed clock signal to improve jitter and noise properties of the spread-spectrum processed clock signal.

Specifically, the PLL includes a voltage-controlled oscillator oscillating at an frequency according to an input voltage, a frequency divider dividing a frequency of an output of the voltage-controlled oscillator, a phase detector comparing phases of a reference clock signal and an output of the frequency divider, and a loop filter smoothing an output of the phase detector, and outputting a voltage for controlling the voltage-controlled oscillator. The loop bandwidth controller controls at least one of the phase detector, the loop filter, the voltage-controlled oscillator, and the frequency divider to change the loop bandwidth of the PLL. The PLL may further include a second frequency divider dividing a frequency of an original clock signal to generate the reference clock signal. In this case, the loop bandwidth controller also controls the second frequency divider when controlling the frequency divider.

The spread spectrum controller and the loop bandwidth controller preferably operate in accordance with a common control signal. This enables a spread spectrum control and a loop bandwidth control for the PLL to operate in association with each other to generate a spread-spectrum processed clock signal with low jitter, low noise, and a low peak.

Moreover, the spread-spectrum clock generator preferably further includes a detector detecting at least one of a peak level, jitter, a noise level, and a frequency change rate of a clock signal output from the PLL; whether or not the clock signal is spread spectrum modulated; and a modulation frequency and a modulation width in the spread spectrum modulation. The loop bandwidth controller changes the loop bandwidth of the PLL based on a detection result of the detector. In this configuration, a spread-spectrum processed clock signal with low jitter, low noise, and a low peak can be generated based on output properties of the PLL.

More preferably, the loop bandwidth controller stores in a memory, a loop bandwidth at the time when the loop bandwidth of the PLL is set to a given value, and the detection result obtained by the detector in association with each other; and reads from the memory, a loop bandwidth of the PLL corresponding to at least one of desired values of the peak level, the jitter, the noise level, and the frequency change rate of the clock signal output from the PLL; whether or not the clock signal is spread spectrum modulated, and the modulation frequency and the modulation width in the spread spectrum modulation; and changes the loop bandwidth of the PLL to become the read loop bandwidth. Alternately, the loop bandwidth controller stores in a memory, a control value for a control target at the time when the detection result obtained by the detector is at a desired value; and changes the loop bandwidth of the PLL with a control value read from the memory. In this configuration, after starting the spread-spectrum clock generator, detection by the detector can be omitted to set the loop bandwidth of the PLL to a desired value in a shorter time.

The spread-spectrum clock generator preferably further includes a comparator comparing a reference voltage, and a control voltage for the voltage-controlled oscillator generated by modulating an output of the loop filter with the spread spectrum controller; and a detector detecting at least one of whether or not a clock signal output from the PLL is spread spectrum modulated, and a modulation frequency and a modulation width in the spread spectrum modulation based on a comparison result obtained by the comparator. The loop bandwidth controller changes the loop bandwidth of the PLL based on a detection result of the detector. In this configuration, contents of the control in the spread spectrum modulation can be detected from the control voltage for the voltage-controlled oscillator to generate a spread-spectrum processed clock signal with low jitter, low noise, and a low peak in accordance with the control contents.

The spread-spectrum clock generator preferably further includes a second phase detector comparing phases of a second reference clock signal, and one of a clock signal output from the PLL and a clock signal output from the frequency divider; and a detector detecting at least one of whether or not a clock signal output from the PLL is spread spectrum modulated, and the modulation frequency and the modulation width in the spread spectrum modulation based on a comparison result obtained by the second phase detector. The loop bandwidth controller changes the loop bandwidth of the PLL based on a detection result of the detector. In this configuration, contents of the control in the spread spectrum modulation can be detected from the output of the PLL or the frequency divider to generate a spread-spectrum processed clock signal with low jitter, low noise, and a low peak in accordance with the control contents.

Specifically, the phase detector selectively outputs one of a source current and a sink current, or one of a source voltage and a sink voltage based on a phase comparison result between the clock signal output from the frequency divider and the reference clock signal. The loop bandwidth controller changes amounts of the source current and the sink current, or magnitudes of the source voltage and the sink voltage.

Further, specifically, the loop filter includes a resistance circuit including at least one resistance element; and a capacitance circuit connected to the resistance circuit, and including at least one capacitance element. The loop bandwidth controller changes at least one of a connection state of the resistance element in the resistance circuit, and a connection state of the capacitance element in the capacitance circuit.

Furthermore, specifically, the voltage-controlled oscillator includes a VI conversion circuit generating a current having an amount according to the input voltage, and a ring oscillator oscillating at a frequency according to the generated current. The loop bandwidth controller changes voltage current conversion gain of the VI conversion circuit.

Also, specifically, the voltage-controlled oscillator includes an inductor circuit including at least one inductor element; and a capacitance circuit connected to the inductor circuit, and including at least one capacitance element. The loop bandwidth controller changes at least one of a connection state of the inductor element in the inductor circuit, and a connection state of the capacitance element in the capacitance circuit.

Further, specifically, the frequency divider is a variable frequency divider. The loop bandwidth controller changes a dividing ratio of the frequency divider.

Furthermore, specifically, the frequency divider and the second frequency divider are variable frequency dividers. The loop bandwidth controller changes dividing ratios of the frequency divider and the second frequency divider at a same rate.

ADVANTAGES OF THE INVENTION

As described above, the present invention improves jitter and noise properties of a spread-spectrum processed clock signal with slight modifications to existing spread-spectrum clock generators.

DESCRIPTION OF REFERENCE CHARACTERS

10 PLL
11 PD (Phase Detector)
12 LPF (Loop Filter)
13 VCO (Voltage-Controlled Oscillator)
14 Frequency Divider
15 Frequency Divider (Second Frequency Divider)
20 Spread Spectrum Controller
30 Loop Bandwidth Controller
40 Detector
50 Comparator
60 PD (Second Phase Detector)
70 Memory
121 Resistance Element (Resistance Circuit)
122 Capacitance Circuit
1221 Capacitance Element
1223 Capacitance Element
131 Ring Oscillator
132 VI Conversion Circuit 133 Inductor Element (Inductor Circuit)
134 Capacitance Circuit
1341 Capacitance Element
1344 Varicap (Capacitance Element)

DESCRIPTION OF EMBODIMENTS

Most preferred embodiments of the present invention will be described hereinafter with reference to the drawings.

First Embodiment

Figure 1:
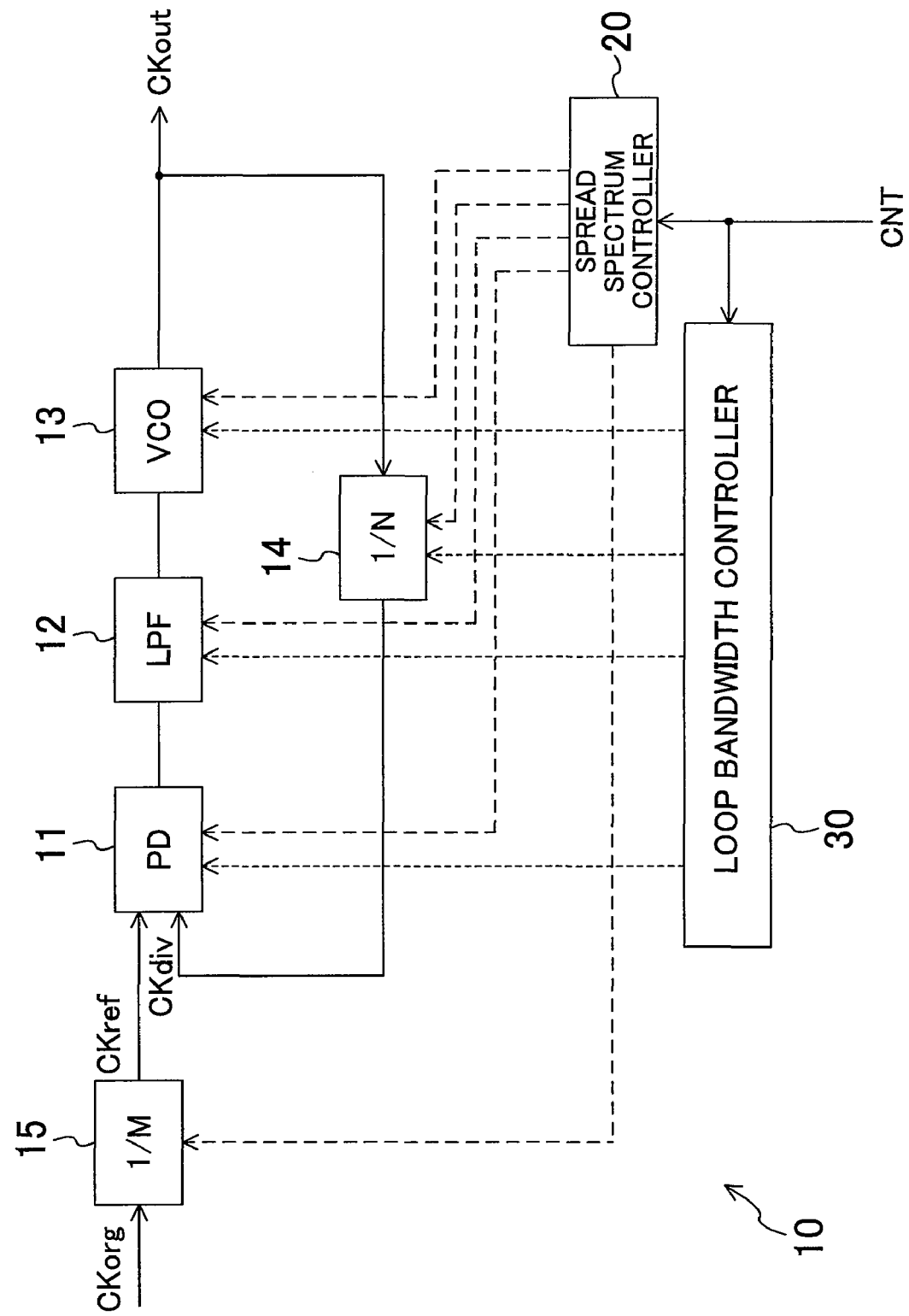
FIG. 1 is a block diagram illustrating a spread-spectrum clock generator according to a first embodiment.

FIG. 1 illustrates a configuration of a spread-spectrum clock generator according to a first embodiment. A PLL 10 receives a clock signal CKref (a reference clock signal), and outputs a clock signal CKout. Specifically, a frequency divider 14 divides a frequency of the clock signal CKout. A phase detector (PD) 11 compares phases of a clock signal CKdiv output from the frequency divider 14, and the clock signal CKref. A loop filter (LPF) 13 smooths an output from the PD 11. A voltage-controlled oscillator (VCO) 13 oscillates at a frequency according to an input voltage, and outputs the clock signal CKout. A frequency divider 15 divides a frequency of a clock signal CKorg (an original clock signal) to generate the clock signal CKref.

A spread spectrum controller 20 controls the PLL 10 so that it outputs a spread-spectrum processed clock signal. Specifically, the spread spectrum controller 20 modulates the input voltage to the VCO 13, changes a dividing ratio of the frequency divider 14 or 15, or accordingly selects one of a plurality of clock signals output from the VCO 13, and having different phases or frequencies. Note that, in the figure, the dashed arrow extending from the spread spectrum controller 20 shows control possibility of the spread spectrum controller 20, and does not mean that the controller controls everything.

A loop bandwidth controller 30 controls at least one of the PD 11, the LPF 12, the VCO 13, and the frequency divider 14. Note that, in the figure, the dashed arrow extending from the loop bandwidth controller 30 shows control possibility of the loop bandwidth controller 30, and does not mean that the controller controls everything. Where a loop bandwidth of the PLL 10 is $\omega$, gain of the PD 11 is Kpd, a transfer function of the LPF 13 is F, gain of the VCO 13 is Kvco, and the dividing ratio of the frequency divider 14 is 1/N; the relationship among these parameters may be expressed by the following formula.

$$\omega \propto Kpd \cdot F \cdot Kvco \cdot (1/N) \quad (1)$$

Therefore, the loop bandwidth of the PLL 10 can be changed by controlling at least one of the PD 11, the LPF 12, the VCO 13, and the frequency divider 14. Specific configurations of elements of the PLL 10, which are controlled by the loop bandwidth controller 30, will be described below.

Example Configuration 1 of Phase Detector

Figure 2:
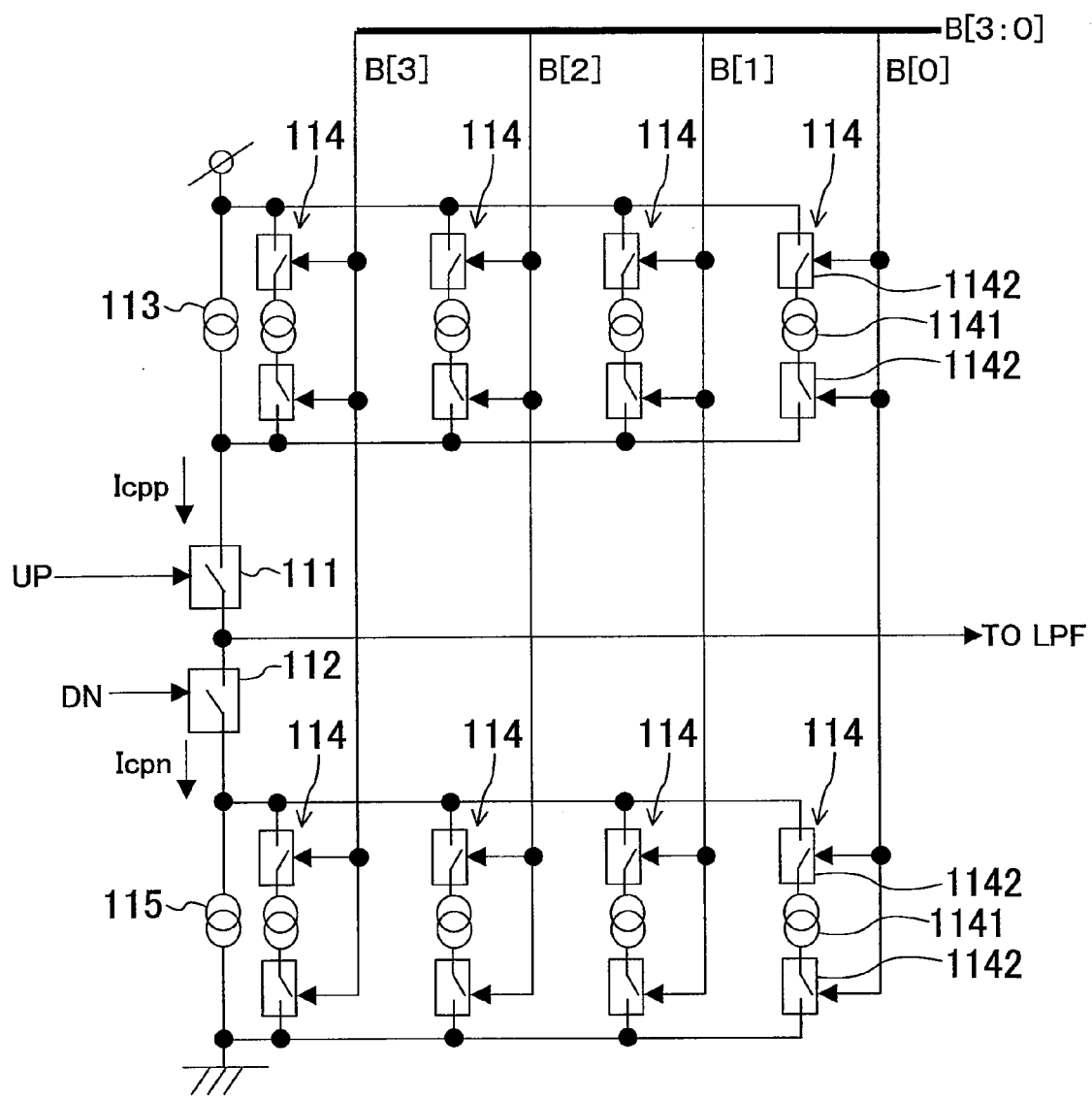
FIG. 2 is a circuit block diagram illustrating an output portion of a phase detector.

FIG. 2 illustrates an example circuit configuration of an output portion (a current-type charge pump circuit) of the PD11. Signals UP and DN are output from a not shown phase detecting part in the PD 11. The signal UP is output when the phase of the clock signal CKref leads the phase of the clock signal CKdiv. The signal DN is output when the phase of the clock signal CKref lags the phase of the clock signal CKdiv. A switch 111 is switching-controlled by the signal UP, and controls whether or not to output a source current Icpp. A switch 112 is switching-controlled by the signal DN, and controls whether or not to output a sink current Icpn.

The source current is supplied from a current source 113, and four current switching circuits 114 parallel connected to the current source 113. The sink current is supplied from a current source 115 and another four current switching circuits 114 parallel connected to the current source 115. Each of the current switching circuits 114 includes a single current source 1141, and a pair of switches 1142 at both ends of the current source 1141. The pairs of switches 1142 are switching-controlled by respective bits of a control signal B coming from the loop bandwidth controller 30. That is, with the control signal B, the amounts of the source current Icpp and the sink current Icpn can be changed. For simplicity of description, the control signal B has 4 bits in this embodiment.

Each current supplied from the current sources 113 and 115 is 16 µA, and currents supplied from current sources corresponding to the third to zeroth bits of the control signal B are 8 µA, 4 µA, 2 µA, and 1 µA, respectively. In this case, when the control signal B [3:0] is "1100," each of the source current Icpp and the sink current Icpn is 28 µA. On the other hand, when the control signal B [3:0] is "1000," each of the source current Icpp and the sink current Icpn is 24 µA. The amounts of the source current Icpp and the sink current Icpn are in proportional to gain of the PD 11. Since the loop bandwidth of the PLL 10 is proportional to the gain of the PD 11 (see formula (1)), the loop bandwidth of the PLL 10 can be changed by changing the amounts of the source current Icpp and the sink current Icpn.

Example Configuration 2 of Phase Detector

Figure 3:
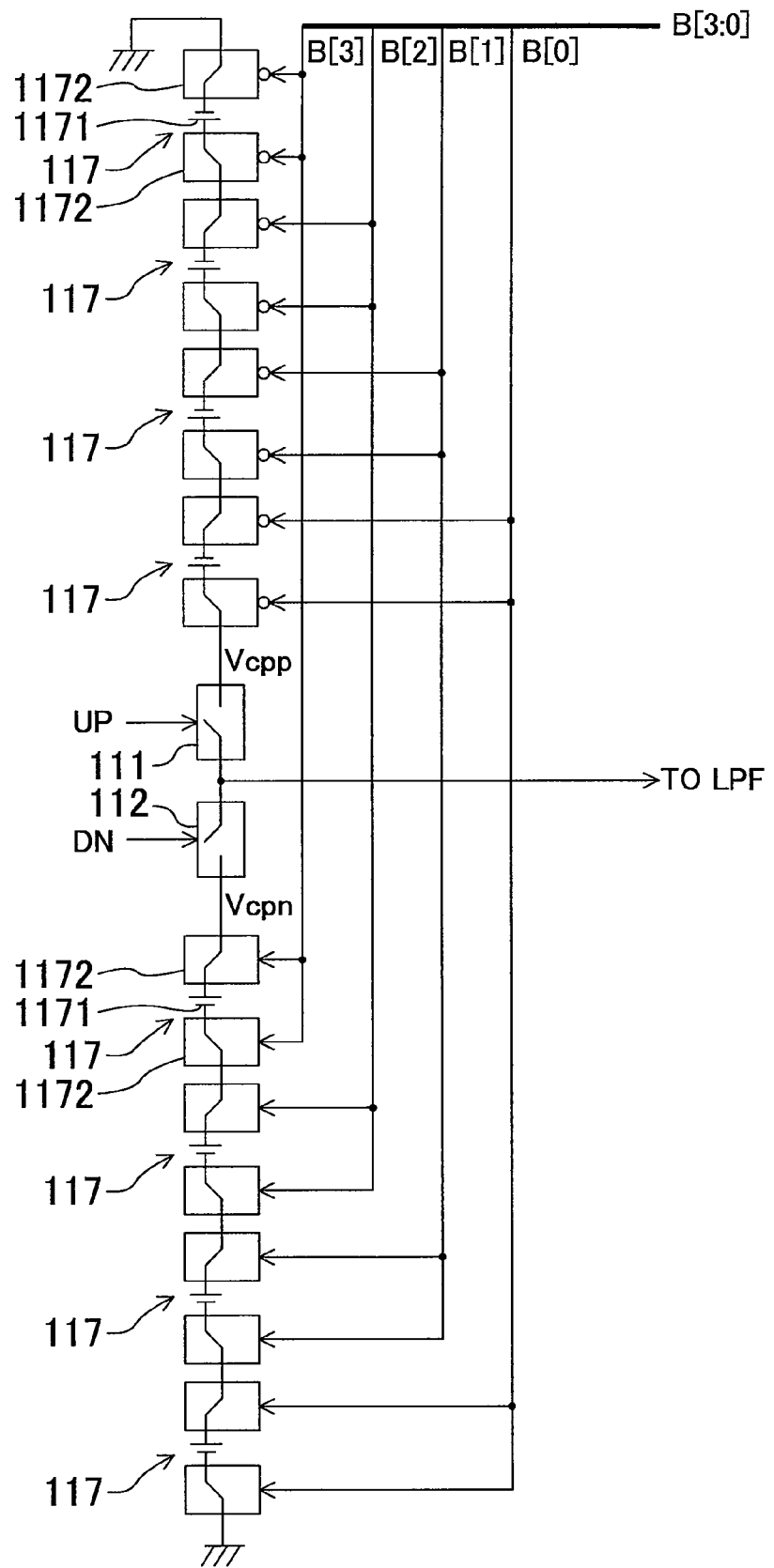
FIG. 3 is a circuit block diagram illustrating an output portion of a phase detector.

FIG. 3 illustrates another example circuit configuration of the output portion (a voltage-type charge pump circuit) of the PD 11. The signals UP and DN are as described above. The switch 111 is switching-controlled by the signal UP, and controls whether or not to output a source voltage Vcpp. The switch 112 is switching-controlled by the signal DN, and controls whether or not to output a sink voltage Vcpn.

The source voltage is supplied from four voltage switching circuits 117 connected in series. The sink voltage is supplied from another four voltage switching circuit 117. Each of the voltage switching circuits 117 includes a single voltage source 1171, and a pair of switches 1172 at both ends of the voltage source 1171. The pairs of switches 1172 for the source voltage supply are switching-controlled by inversion of the bits of the control signal B coming from the loop bandwidth controller 30. On the other hand, the pairs of switches 1172 for the sink voltage supply are switching-controlled by the bits of the control signal B. That is, with the control signal B, the magnitudes of the source voltage Vcpp and the sink voltage Vcpn can be changed. For simplicity of description, the control signal B has 4 bits in this embodiment.

Voltages at the voltage sources for the source voltage supply corresponding to the third to zeroth bits of the control signal B are 3.0 V, 0.3 V, 0.2 V, and 0.1 V, respectively. Voltages at the voltage sources for the sink voltage supply corresponding to the third to zeroth bits of the control signal B are 0.4 V, 0.3 V, 0.2 V, and 0.1 V, respectively. In this case, when the control signal B [3:0] is "1100," the source voltage Vcpp is 3.3 V (=3.0+0.3), and the sink voltage Vcpn is 0.3 V (0.2+0.1). Therefore, a width of an output voltage of the PD 11 is 3.0 V (3.3−0.3). On the other hand, when the control signal B [3:0] is "1000," the source voltage Vcpp is 3.0 V, and the sink voltage Vcpn is 0.6 V (=0.3+0.3+0.1). Therefore, the width of the output voltage of the PD 11 is 2.4 V (3.0−0.6).

The width of the output voltage of the PD 11, which depends on the source voltage Vcpp and the sink voltage Vcpn, is proportional to the gain of the PD 11. Since the loop bandwidth of the PLL 10 is proportional to the gain of the PD 11 (see formula (1)), the loop bandwidth of the PLL10 can be changed by changing the magnitudes of the source voltage Vcpp and the sink voltage Vcpn.

Example Configuration of Loop Filter

Figure 4:
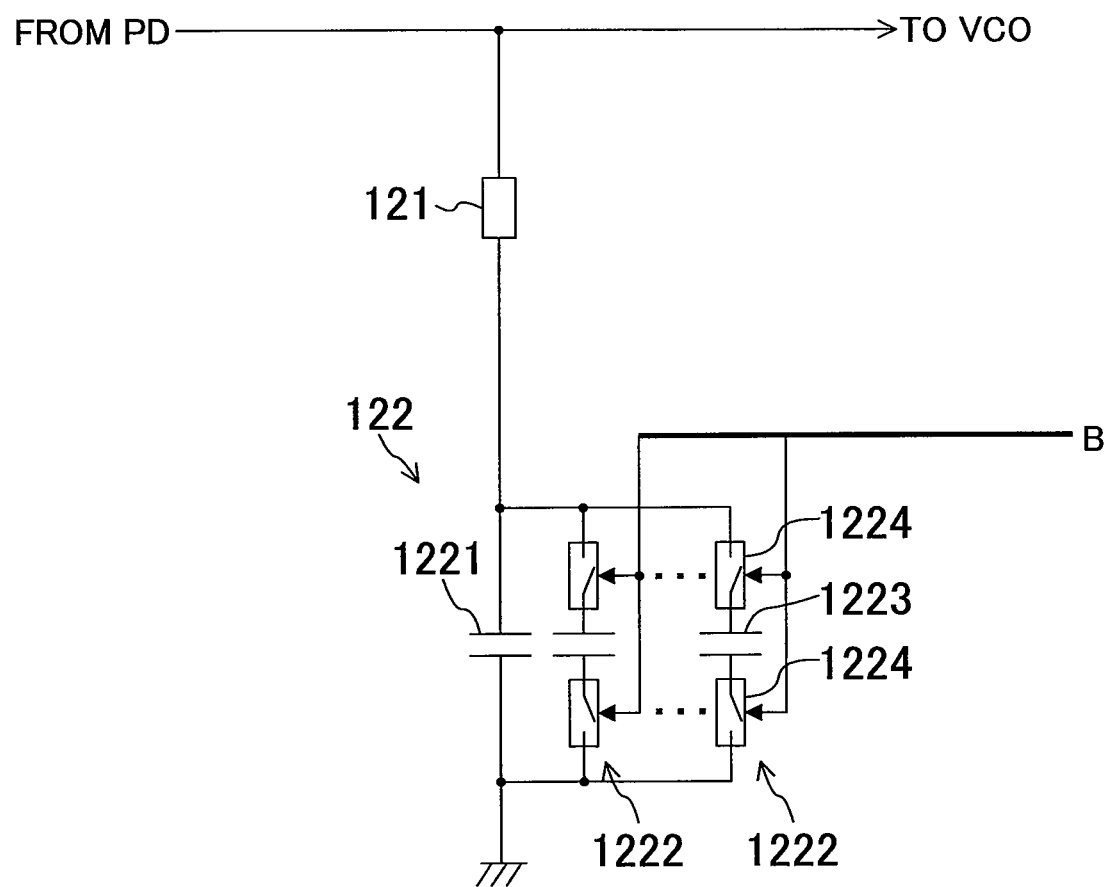
FIG. 4 is a circuit block diagram of a loop filter.

FIG. 4 illustrates an example circuit configuration of the LPF 12. The LPF 12 includes a resistance element 121 as a resistance circuit, and a capacitance circuit 122 series-connected to the resistance element 121. The capacitance circuit 122 includes a capacitance element 1221, and a plurality of capacitance switching circuits 1222 parallel connected to the capacitance element 1221. Each of the capacitance switching circuits 1222 includes a single capacitance element 1223, and a pair of switches 1224 at both ends of the capacitance element 1223. The pairs of switches 1224 are switching-controlled by respective bits of the control signal B coming from the loop bandwidth controller 30. That is, a transfer function of the LPF 12 can be changed by changing the total capacitance of the capacitance circuits 122 with the control signal B. Since the loop bandwidth of the PLL 10 is proportional to the transfer function of the LPF 12 (see formula (1)), the loop bandwidth of the PLL 10 can be changed by changing a connection state of the capacitance elements 1221 and 1223 in the capacitance circuit 122.

Note that the resistance circuit may include a plurality of resistance elements to change connection states of the resistance elements in the resistance circuit. In this case, the transfer function of the LPF 12 changes with a change of the total resistance in the resistance circuit. This changes the loop bandwidth of the PLL 10.

Example Configuration 1 of Voltage-controlled Oscillator

Figure 5:
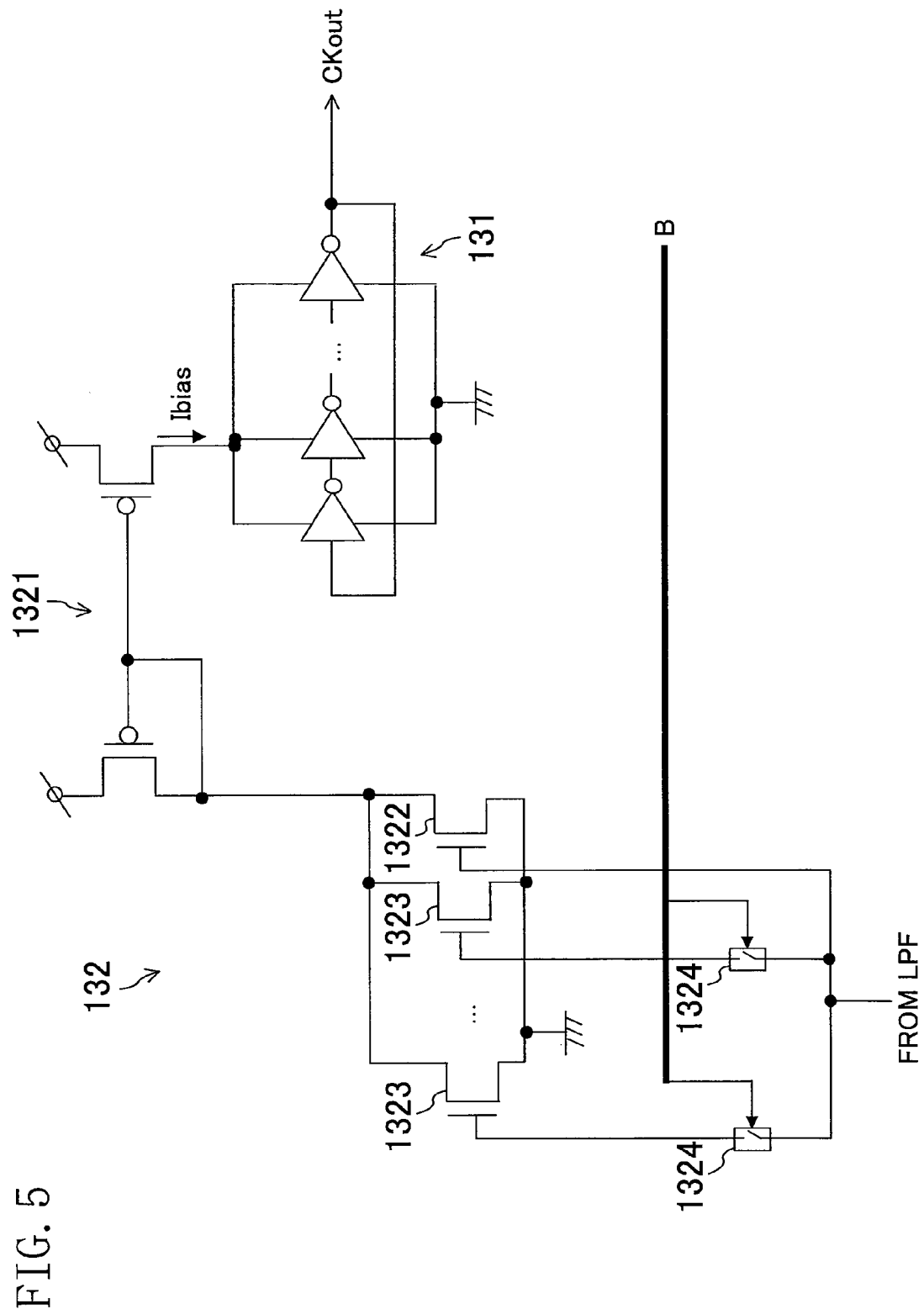
FIG. 5 is a circuit block diagram of a voltage-controlled oscillator.

FIG. 5 illustrates an example circuit configuration of the VCO 13. A ring oscillator 131 oscillates at a frequency according to a given bias current Ibias to output the clock signal CKout. A VI conversion circuit 132 generates the bias current Ibias. The bias current Ibias is output from a current mirror circuit 1321. A transistor 1322 and a plurality of transistors 1323 parallel connected to the transistor 1322 are connected to an input of the current mirror circuit 1321. An input voltage of the VCO 13 is applied to a gate of the transistor 1322. The input voltage of the VCO 13 is applied to gates of the transistors 1323 via switches 1324. The switches 1324 are switching-controlled by respective bits of the control signal B coming from the loop bandwidth controller 30. That is, the control signal B controls on/off states of the transistors 1323 to change voltage current conversion gain of the VI conversion circuit 132, thereby changing that the gain of the VCO 13. Since the loop bandwidth of the PLL 10 is proportional to the gain of the VCO 13 (see formula (1)), the loop bandwidth of the PLL 10 can be changed by changing the voltage current conversion gain of the VI conversion circuit 132.

Example Configuration 2 of Voltage-controlled Oscillator

Figure 6:
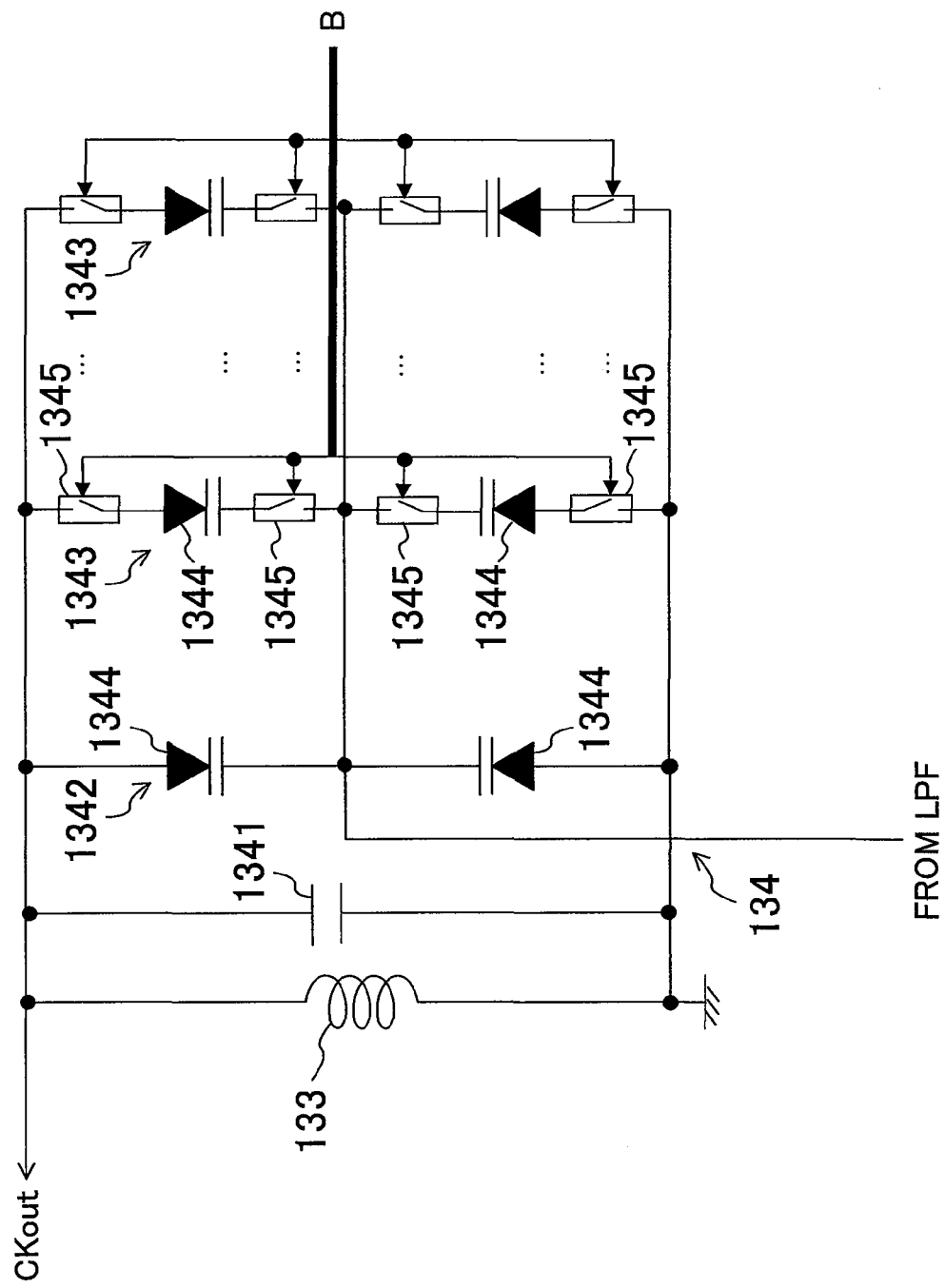
FIG. 6 is a circuit block diagram of a voltage-controlled oscillator.

FIG. 6 illustrates another example circuit configuration of the VCO 13. The VCO 13 includes an inductor element 133 as an inductor circuit, and a capacitance circuit 134 parallel connected to the inductor element 133. The capacitance circuit 134 includes a capacitance element 1341, a pair of varicaps 1342 parallel connected to the capacitance element 1341, and a plurality of varicap switching circuits 1343. The pair of varicaps 1342 includes two varicaps 1344 facing each other. An input voltage of the VCO 13 is applied to a connecting point of the two varicaps 1344. In each of the varicap switching circuits 1343, one of the varicaps 1344 and a pair of switches 1345 at both ends of the varicap are connected to face each other. The input voltage of the VCO 13 is applied to the connecting point. The pairs of switches 1345 are switching-controlled by respective bits of the control signal B coming from the loop bandwidth controller 30. That is, the gain of the VCO 13 can be changed by changing the total capacitance in the capacitance circuit 134 with the control signal B. Since the loop bandwidth of the PLL 10 is proportional to the gain of the VCO 13 (see formula (1)), the loop bandwidth of the PLL 10 can be changed by changing a connection state of the capacitance element 1341 and the varicaps 1344 in the capacitance circuit 134.

Note that the inductor circuit may include a plurality of inductor elements to change connection states of the inductor elements in the inductor circuit. In this case, the gain of the VCO 13 changes with a change of the total inductance in the inductor circuit. This changes the loop bandwidth of the PLL 10.

Example Configuration of Frequency Divider

The frequency divider 14 changes a dividing ratio in accordance with the control signal B coming from the loop bandwidth controller 30. For example, when the control signal B [3:0] is "1000," the frequency divider 14 sets the dividing ratio to 1/8. When the control signal B [3:0] is "1100," the frequency divider 14 sets the dividing ratio to 1/12.

Since the loop bandwidth of the PLL 10 is proportional to the dividing ratio of the frequency divider 14 (see formula (1)), the loop bandwidth of the PLL 10 can be changed by changing the dividing ratio of the frequency divider 14.

When changing the dividing ratio of the frequency divider 14, a dividing ratio of the frequency divider 15 is changed at the same time. This changes the loop bandwidth of the PLL 10, while holding the frequency of the clock signal CKout constant. For example, where the dividing ratios of the frequency dividers 14 and 15 are 1/8 and 1/4, respectively, and a frequency of the clock signal CKorg is 24 MHz; the frequency of the clock signal CKout is 48 MHz. When changing the dividing ratio of the frequency divider 14 to 1/12, the dividing ratio of the frequency divider 15 is set to 1/6. This sets the loop bandwidth of the PLL 10 to 2/3, while holding the clock signal CKout at the frequency of 48 MHz.

Next, timing of a change in the loop bandwidth of the PLL 10 will be described below. The loop bandwidth controller 30 changes the loop bandwidth of the PLL 10 in accordance with an operation of the spread spectrum controller 20. Specifically, as shown in FIG. 1, the spread spectrum controller 20 and the loop bandwidth controller 30 may operate in accordance with a common control signal CTL. Some example controls will be described below.

Control Example 1

A control signal CTL controls on/off states of the spread spectrum control. When the control signal CTL turns the spread spectrum control on, the loop bandwidth controller 30 increases the loop bandwidth of the PLL 10 to lower the peak of the clock signal CKout. On the other hand, when the control signal CTL turns the spread spectrum control off, the loop bandwidth controller 30 reduces the loop bandwidth of the PLL 10 to improve jitter and noise properties of the clock signal CKout.

Control Example 2

The control signal CTL changes a modulation frequency in spread spectrum modulation. When the control signal CTL sets the modulation frequency in the spread spectrum high, the loop bandwidth controller 30 reduces the loop bandwidth of the PLL 10 to improve jitter and noise properties of the clock signal CKout. On the other hand, the control signal CTL sets the modulation frequency in the spread spectrum low, the loop bandwidth controller 30 increases the loop bandwidth of the PLL 10 to lower the peak of the clock signal CKout.

Example Control 3

The control signal CTL changes a modulation width in spread spectrum modulation. When the control signal CTL sets the modulation width in the spread spectrum large, the loop bandwidth controller 30 reduces the loop bandwidth of the PLL 10 to improve jitter and noise properties of the clock signal CKout. On the other hand, when the control signal CTL sets the modulation width in the spread spectrum small, the loop bandwidth controller 30 increases the loop bandwidth of the PLL 10 to lower the peak of the clock signal CKout.

A control target of the spread spectrum controller 20 may be the same as a control target of the loop bandwidth controller 30. In this case, the target is either (1) controlled by a signal generated by synchronizing control results obtained by the controllers, or (2) controlled by a signal generated by synchronizing control signals output from the controllers. For example, when the LPF 12 having the configuration shown in FIG. 4 is controlled by the control system (1), the loop bandwidth controller 30 changes the capacitance of the capacitance element 1221 to set the loop bandwidth at a desired value, and the spread spectrum controller 20 outputs the control signal B to control the spread spectrum modulation.

On the other hand, in the control system (2), the control signal of the spread spectrum controller 20 and the control signal of the loop bandwidth controller 30 are subjected to a logical operation to become the control signal B to control the plurality of switches 1224.

Figure 7:
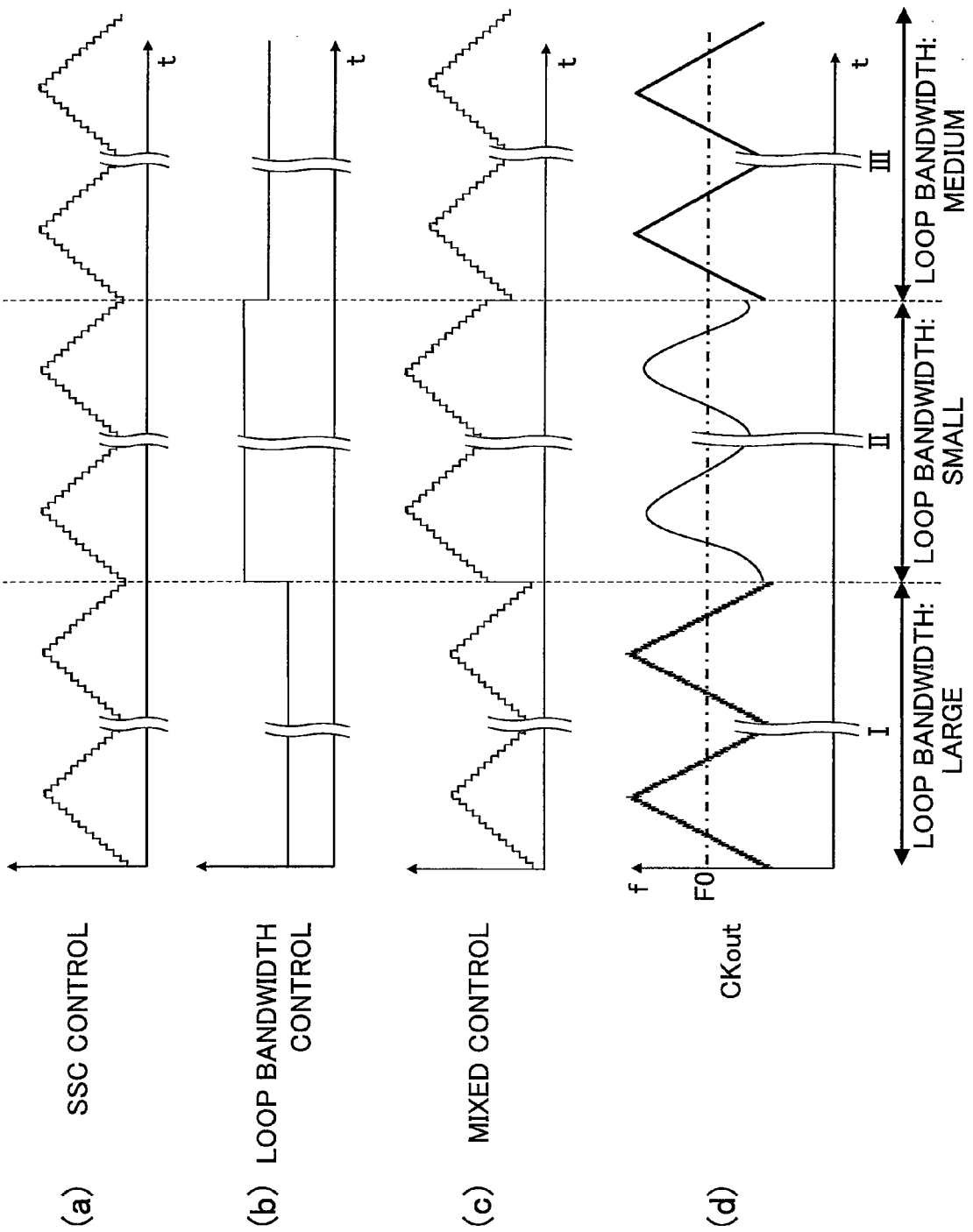
FIG. 7 is a waveform diagram of signals when a spread spectrum control and a loop bandwidth control are mixed.

FIG. 7 illustrates waveforms of signals when a spread spectrum control and a loop bandwidth control are mixed. FIG. 7(a) shows a control signal output from the spread spectrum controller 20. FIG. 7(b) shows a control signal output from the loop bandwidth controller 30. FIG. 7(c) shows a synthesized signal of the output signals. FIG. 7(d) shows a clock signal CKout. In the drawings, the loop bandwidth is set large in an interval I, small in an interval II and medium in an interval III. The clock signal CKout is held constant at a center frequency FO throughout the intervals I-III. Due to the differences in the loop bandwidth of the PLL 10, the waveforms in the intervals I and III are shown by straight lines, and the waveform in the interval II is shown by a distorted line. Noise and jitter contained in the clock signal CKout is relatively large in the interval I, relatively small in the interval II and medium in the interval III.

Figure 8:
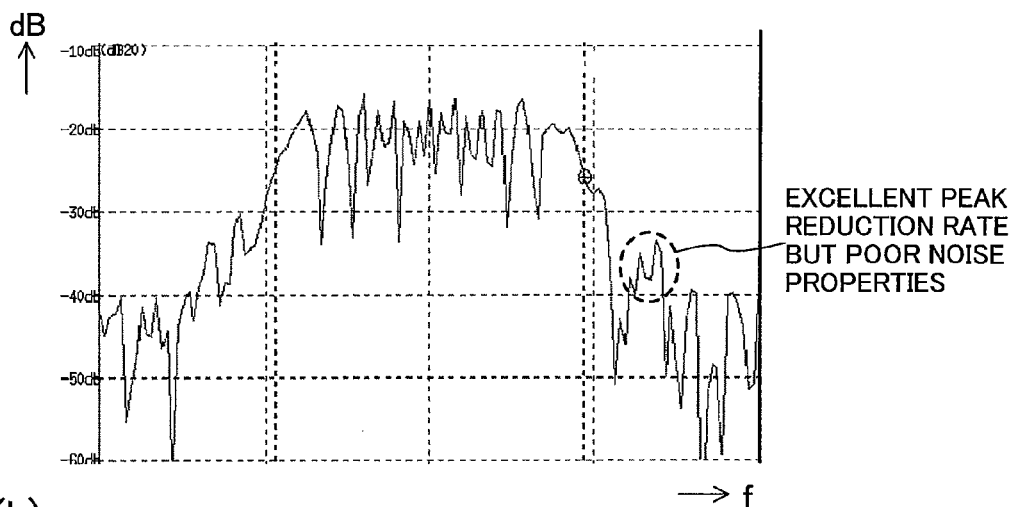
FIG. 8 is a spectrum waveform diagram of an output clock signal corresponding to intervals shown in FIG. 7.
Figure 8:
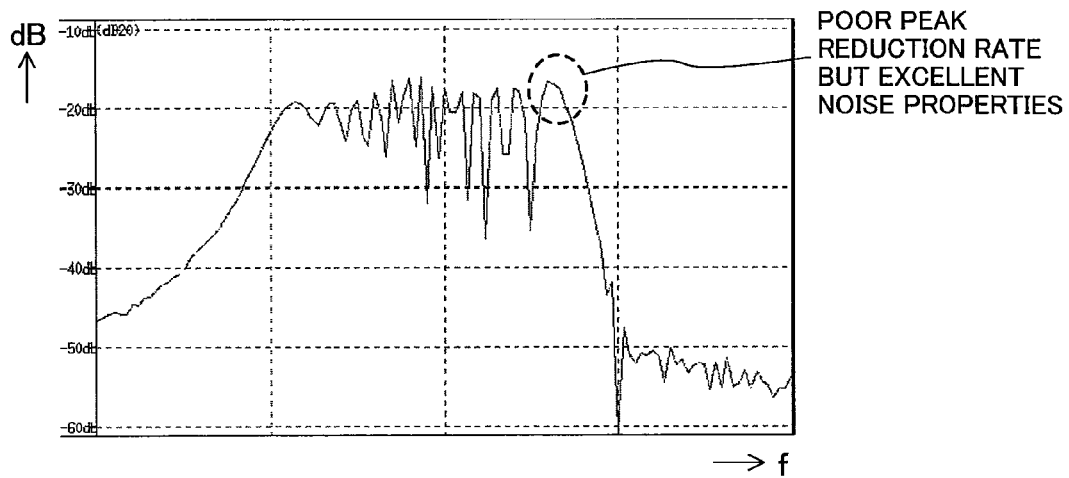
Figure 8:
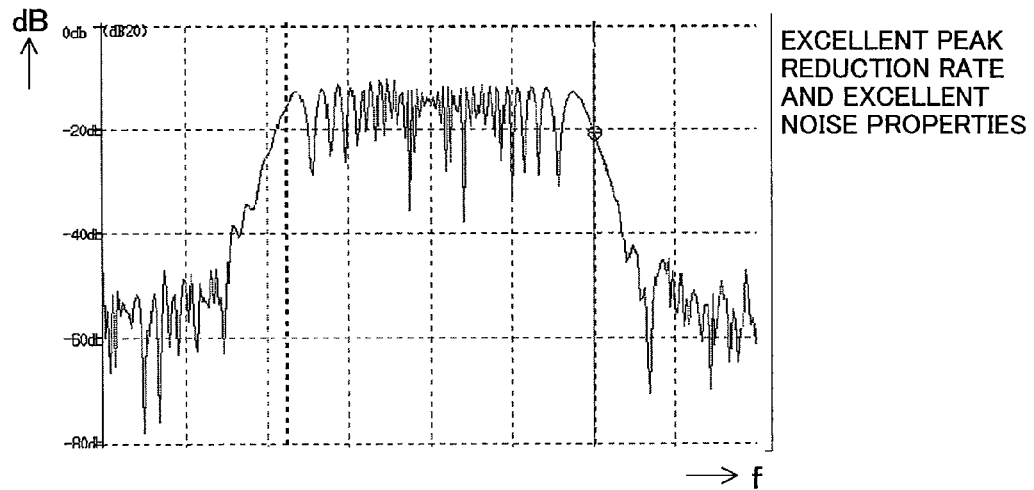

FIG. 8 illustrates spectrum waveforms of the clock signal CKout corresponding to the intervals I-III. FIG. 8(a) shows the spectrum waveform of the clock signal CKout corresponding to the interval I. In the interval I, a peak reduction rate is excellent but the noise properties are slightly poor. FIG. 8(b) shows the spectrum waveform of the clock signal CKout corresponding to the interval II. In the interval II, the noise properties are excellent but the peak reduction rate is slightly poor. FIG. 8(c) shows the spectrum waveform of the clock signal CKout corresponding to the interval III. In the interval III, both of the peak reduction rate and the noise properties are excellent.

As described above, according to this embodiment, the spread spectrum control and the loop bandwidth control operate in association with each other to control the PLL 10. As a result, the spread-spectrum processed clock signal CKout can be generated, which has low jitter, low noise and a low peak.

Note that a PLL to be controlled is not limited to an analog circuit, but may be a digital circuit. When there is no need to change the dividing ratio of the frequency divider 14, the frequency divider 15 may be omitted. The VCO 13 may be replaced with a current-controlled oscillator.

Second Embodiment

Figure 9:
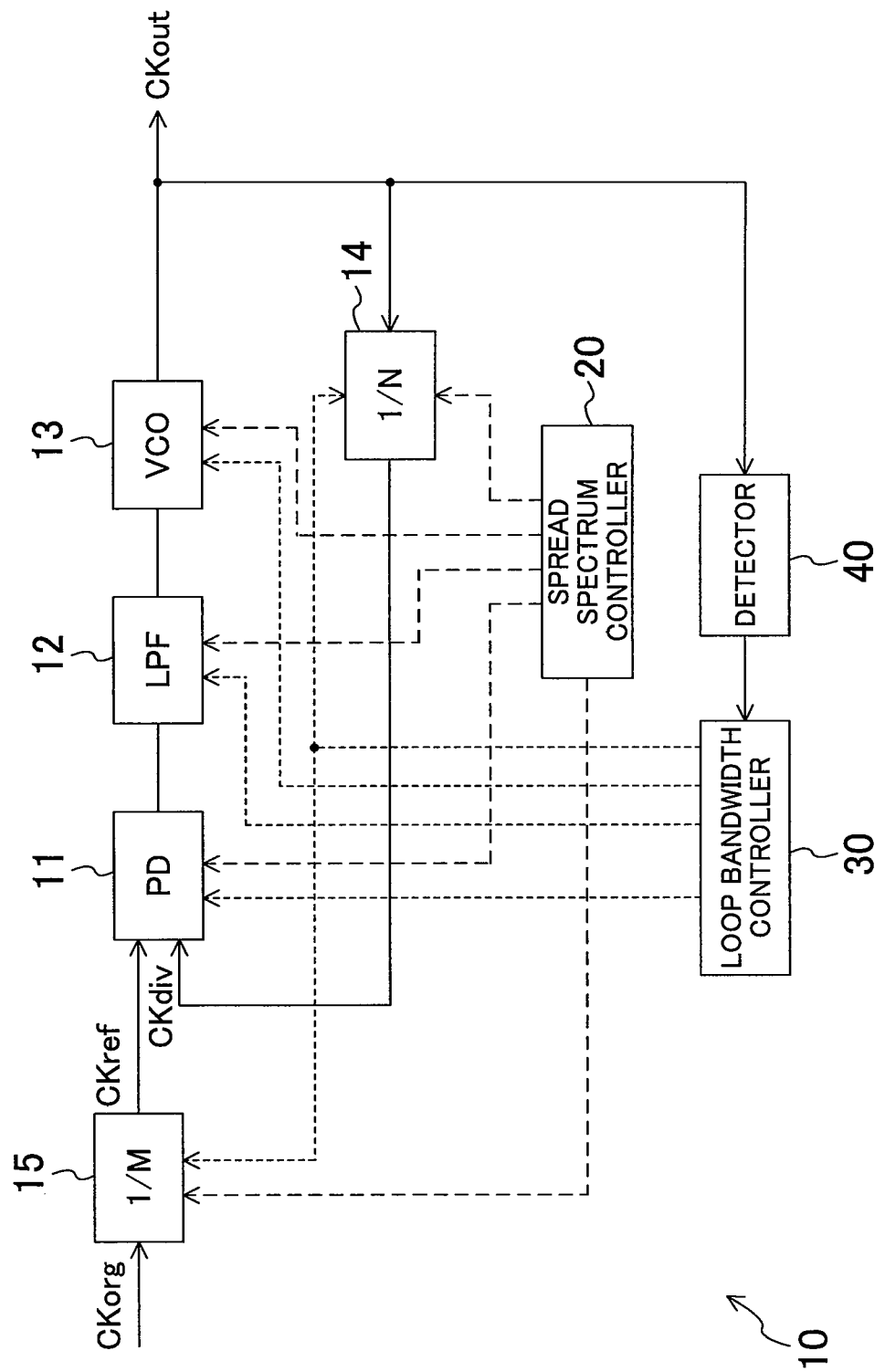
FIG. 9 is a block diagram of a spread-spectrum clock generator according to a second embodiment.

FIG. 9 illustrates configuration of a spread-spectrum clock generator according to a second embodiment. In this embodiment, the generator further includes a detector 40 in addition to the generator according to the first embodiment. Only differences from the first embodiment will be described below.

The detector 40 detects at least one of a peak level, jitter, and a noise level of the clock signal CKout output from the PLL 10; whether or not the clock signal CKout is spread spectrum modulated; and the modulation frequency and the modulation width in the spread spectrum modulation. When a frequency change rate of the spread-spectrum processed clock signal CKout is restricted by some standards, the detector 40 may detect the frequency change rate of the clock signal CKout.

Figure 10:
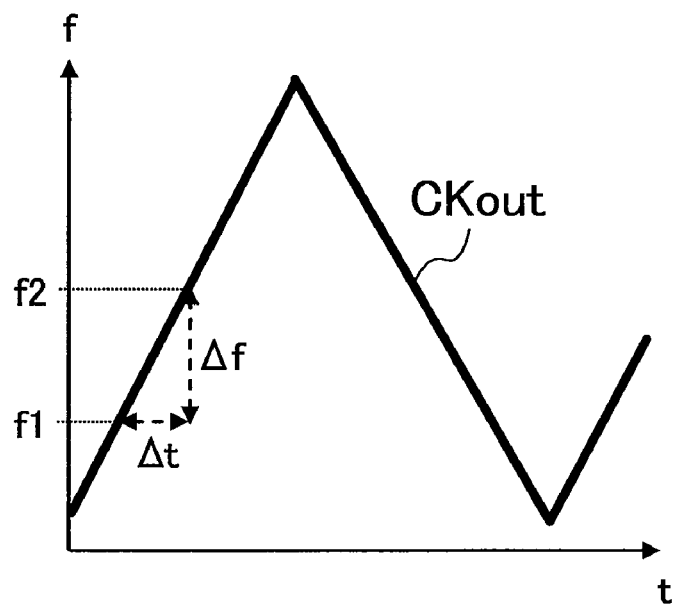
FIG. 10 illustrates a frequency change rate.
Figure 10:
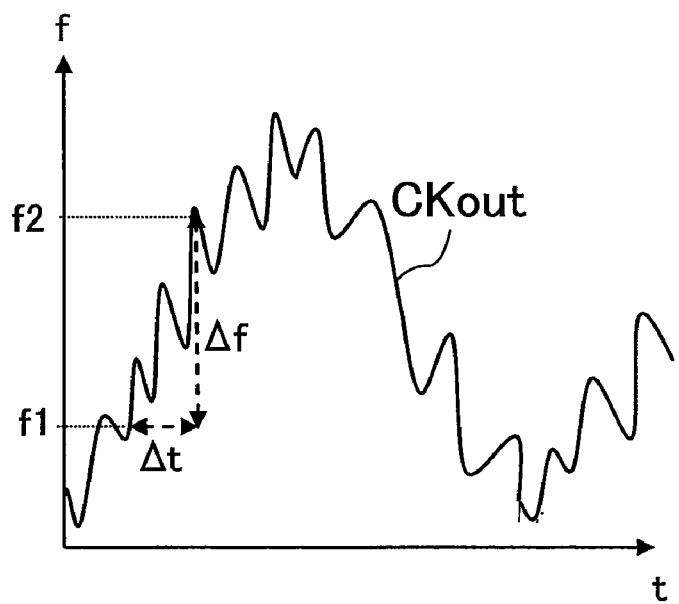
Figure 11:
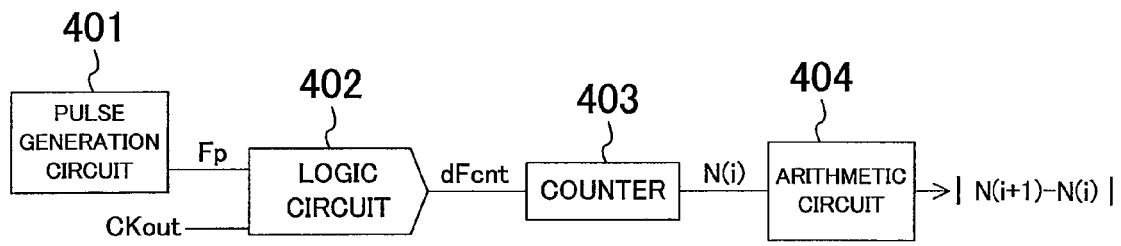
FIG. 11 is a circuit block diagram for detecting the frequency change rate.
Figure 12:
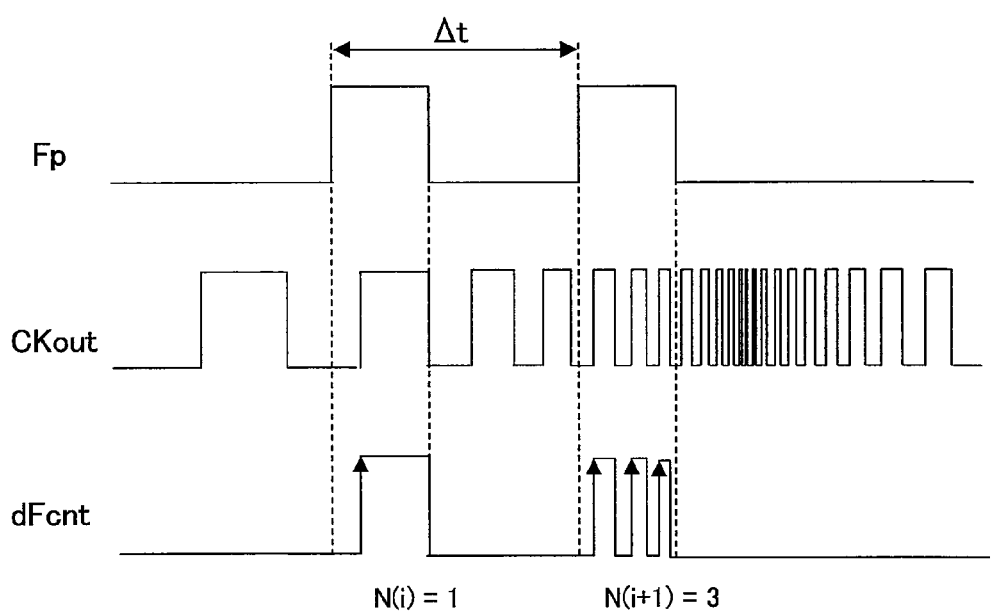
FIG. 12 is a timing chart of a frequency change rate detection circuit shown in FIG. 11.

The frequency change rate is, as shown in FIGS. 10(a) and 10(b), defined as frequency fluctuations of the clock signal CKout per unit time ($\Delta f/\Delta t$). FIG. 11 illustrates a configuration of a circuit for detecting the frequency change rate. FIG. 12 is a timing chart of the circuit. A pulse generation circuit 401 outputs a signal Fp at an interval corresponding to the unit time $\Delta t$. A logic circuit 402 receives the clock signal CKout when the signal Fp is "H," and outputs the result as a signal dFcnt, A counter 403 counts rising edges of the signal dFcnt per unit time $\Delta t$. An arithmetic circuit 404 calculates the difference between an i–th count value and an i+1th count value of the counter 403. The calculated value |N(i+1)−N(i)| corresponds to the frequency change rate.

The loop bandwidth controller 30 changes the loop bandwidth of the PLL 10 based on a detection result obtained by the detector 40. Specifically, when the peak level of the clock signal CKout is higher than a given value, the jitter is smaller than a given value, the noise level is lower than a given value, or the frequency change rate is smaller than a desired value; the loop bandwidth controller 30 increases the loop bandwidth of the PLL 10 to lower the peak of the clock signal CKout. On the other hand, when the peak level of the clock signal CKout is lower than the given value, the jitter is larger than the given value, the noise level is higher than the given value, or the frequency change rate is larger than the desired value; the loop bandwidth controller 30 reduces the loop bandwidth of the PLL 10 to improve the jitter and noise properties of the clock signal CKout. The control target of the loop bandwidth controller 30 is as described above.

Figure 13:
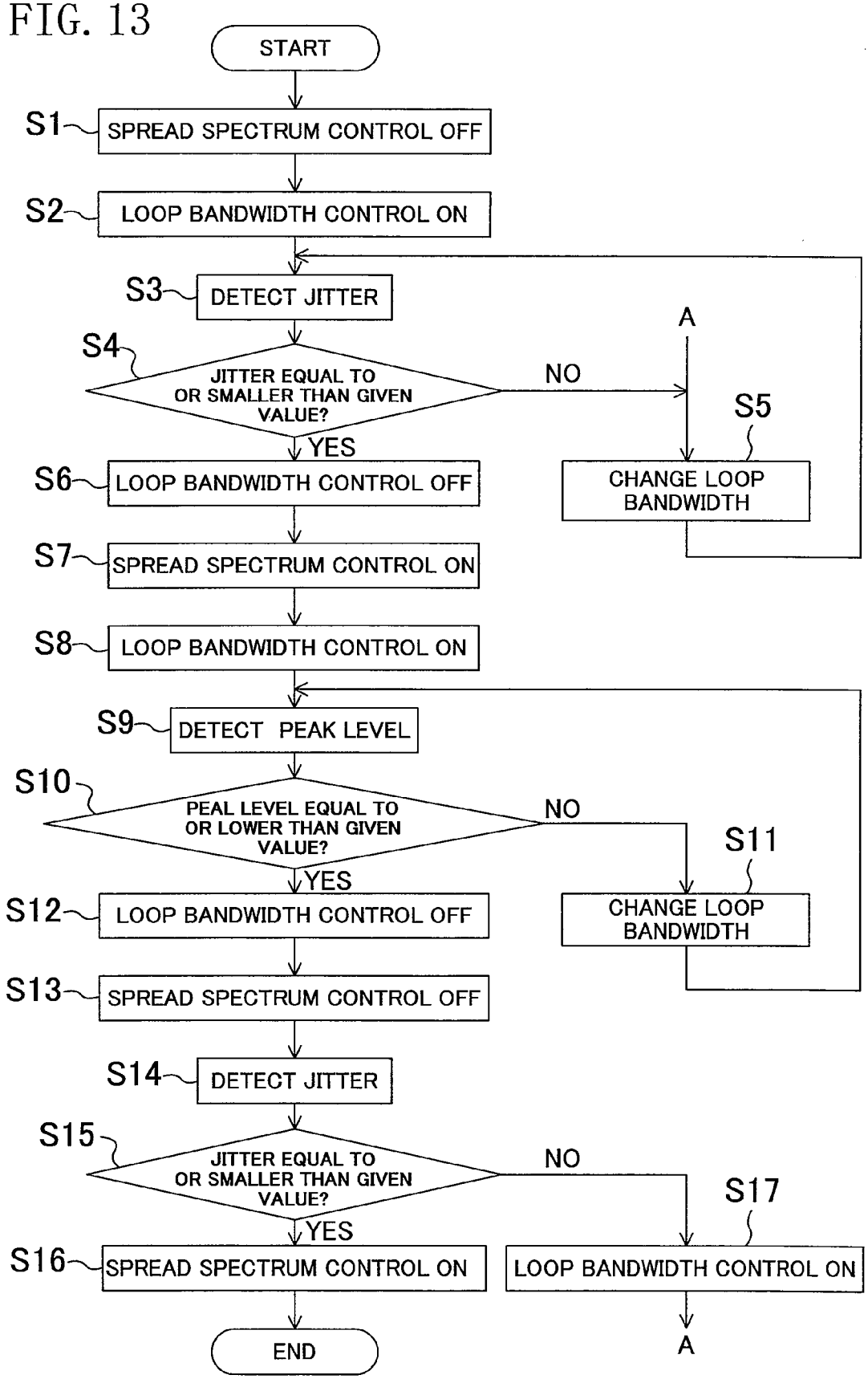
FIG. 13 is a flow chart for changing a loop bandwidth of a PLL based on a detection result with respect to a peak level and jitter of a clock signal.

The loop bandwidth controller 30 may change the loop bandwidth of the PLL 10 based on two or more detection results obtained by the detector 40 with respect to the peak level, the jitter, and the noise level of the clock signal CKout; whether or not the clock signal CKout is spread spectrum modulated; and the modulation frequency and the modulation width in the spread spectrum modulation. FIG. 13 illustrates a flow for changing the loop bandwidth of the PLL 10 based on the detection results with respect to the peak level and the jitter of the clock signal CKout. First, the spread spectrum control is turned off (S1) and the loop bandwidth control is turned on (S2), and the jitter of the clock signal CKout is detected (S3). When the detected jitter is larger than a given value (e.g., 50 ps) (NO in step S4), the loop bandwidth of the PLL 10 is changed (S5), and then the jitter of the clock signal CKout is detected again (S3). On the other hand, when the detected jitter is at the given value or smaller (YES in step S4), the loop bandwidth control is turned off (S6).

Next, the spread spectrum control is turned on (S7), and the loop bandwidth control is turned on (S8) to detect the peak level of the clock signal CKout (S9). When the detected peak level is higher than a given value (e.g., −10 dBm) (NO in step S10), the loop bandwidth of the PLL 10 is changed (S11), and then the peak level of the clock signal CKout is detected again (S9). On the other hand, when the detected peak level is at the given value or lower (YES in step S10), the loop bandwidth control is turned off (S12).

Then, the spread spectrum control is again turned off (S13) to detect the jitter of the clock signal CKout (S14). When the detected jitter is at a given value or smaller (e.g., 50 ps) (YES in step S15), the spread spectrum controller is turned on (S16). As a result, the system can be operated with the spread-spectrum processed clock signal CKout, which has a peak level and jitter equal to or lower than the given values. On the other hand, when the detected jitter is larger than the given value (NO in step S15), the loop bandwidth control of the PLL 10 is turned off (S17), and then, the process goes back to the step S5 to repeat the above-described steps. After the process is repeated given times, the loop bandwidth control of the PLL 10 may be stopped.

In step S15, when the jitter of the detected clock signal is larger than the given value, the output of the clock signal CKout may be stopped without controlling the loop bandwidth of the PLL 10. When the difference between the detected jitter and the desired jitter value, and the difference between the detected peak level and the desired peak level are both minimum; or when either one of the differences is minimum; the loop bandwidth control may be stopped. The system may operate while changing the loop bandwidth of the PLL 10 and the loop bandwidth of the PLL 10 can be changed during the operation of the system.

Only the VCO 13 may be controlled in step S5 to change the loop bandwidth, and only the PD 11 may be controlled in step S17 to change the loop bandwidth. This easily secures the gain, the transfer function, and the dividing ratio required for the PD 11, the LPF 12, the VCO 13, and the frequency divider 14 in the PLL 10.

As described above, according to this embodiment, the spread-spectrum processed clock signal CKout having low jitter, low noise, and a low peak can be generated based on output properties of the PLL 10 or spread spectrum modulation properties. Note that the detector 40 may be provided in an outer peripheral device apart from the spread-spectrum clock generator. Instead of the clock signal CKout, the clock signal CKdiv output from the frequency divider 14 may be input to the detector 40.

Third Embodiment

Figure 14:
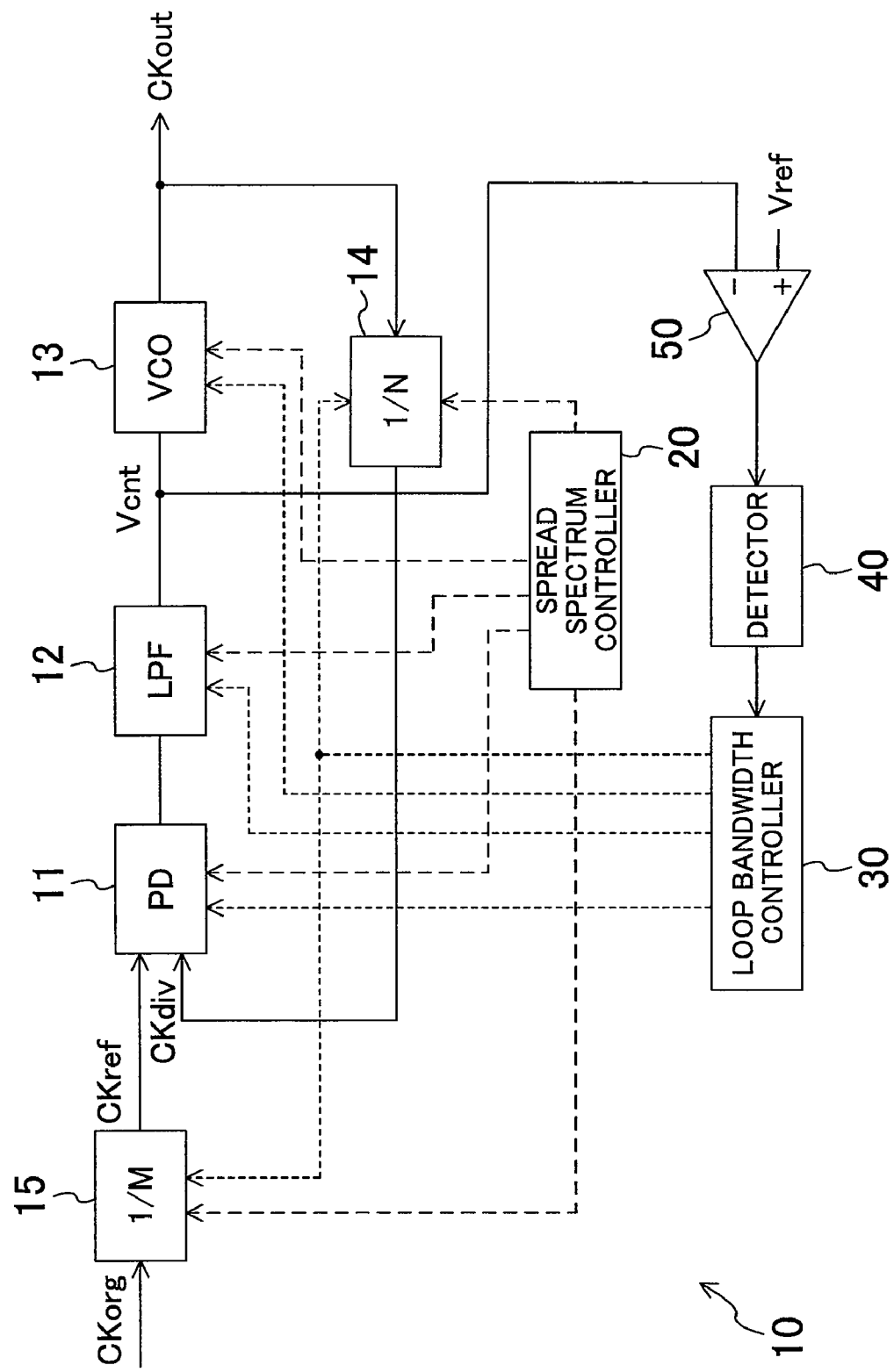
FIG. 14 is a block diagram of a spread-spectrum clock generator according to a third embodiment.

FIG. 14 illustrates a configuration of a spread-spectrum clock generator according to a third embodiment. The generator according to this embodiment further includes a comparator 50 in addition to the generator according to the second embodiment. Only differences from the second embodiment will be described below.

The spread spectrum controller 20 modulates a control voltage Vcnt input from the LPF 20 to the VCO 13, the dividing ratio of the frequency divider 14, or the dividing ratio of the frequency divider 15. The comparator 50 compares the control voltage Vcnt and a reference voltage Vref. Specifically, the reference voltage Vref is a center voltage of the control voltage Vcnt.

The detector 40 detects contents of the control on the PLL 10 in the spread spectrum modulation based on a comparison result of the comparator 50. For example, it can be detected that the clock signal CKout output from the PLL 10 is spread spectrum modulated when an output level of the comparator 50 changes periodically, and that no spread spectrum modulation is performed when it does not change periodically. Moreover, the modulation frequency in the spread spectrum modulation can be detected from a fluctuation cycle of the output level of the comparator 50. Moreover, the modulation width in the spread spectrum modulation can be detected from the maximum value of the output level of the comparator 50, i.e., the maximum difference between the control voltage Vcnt and the reference voltage Vref.

The loop bandwidth controller 30 changes the loop bandwidth of the PLL 10 based on the detection result obtained by the detector 40. Specifically, when the clock signal CKout is spread spectrum modulated, when the modulation frequency in the spread spectrum modulation is relatively high, or when the modulation width in the spread spectrum modulation is relatively large; the loop bandwidth controller 30 increases the loop bandwidth of the PLL 10 to lower the peak of the clock signal CKout. On the other hand, when the clock signal CKout is not spread spectrum modulated, when the modulation frequency in the spread spectrum modulation is relatively low, or when the modulation width in the spread spectrum is relatively small; the loop bandwidth controller 30 reduces the loop bandwidth of the PLL 10 to improve the jitter and noise properties of the clock signal CKout. Note that the control target of the loop bandwidth controller 30 is as described above.

As described above, according to this embodiment, the contents of the control for the spread spectrum modulation are detected from the control voltage for the VCO 13. In accordance with the contents, the spread-spectrum processed clock signal CKout can be generated, which has low jitter, low noise, and a low peak.

Fourth Embodiment

Figure 15:
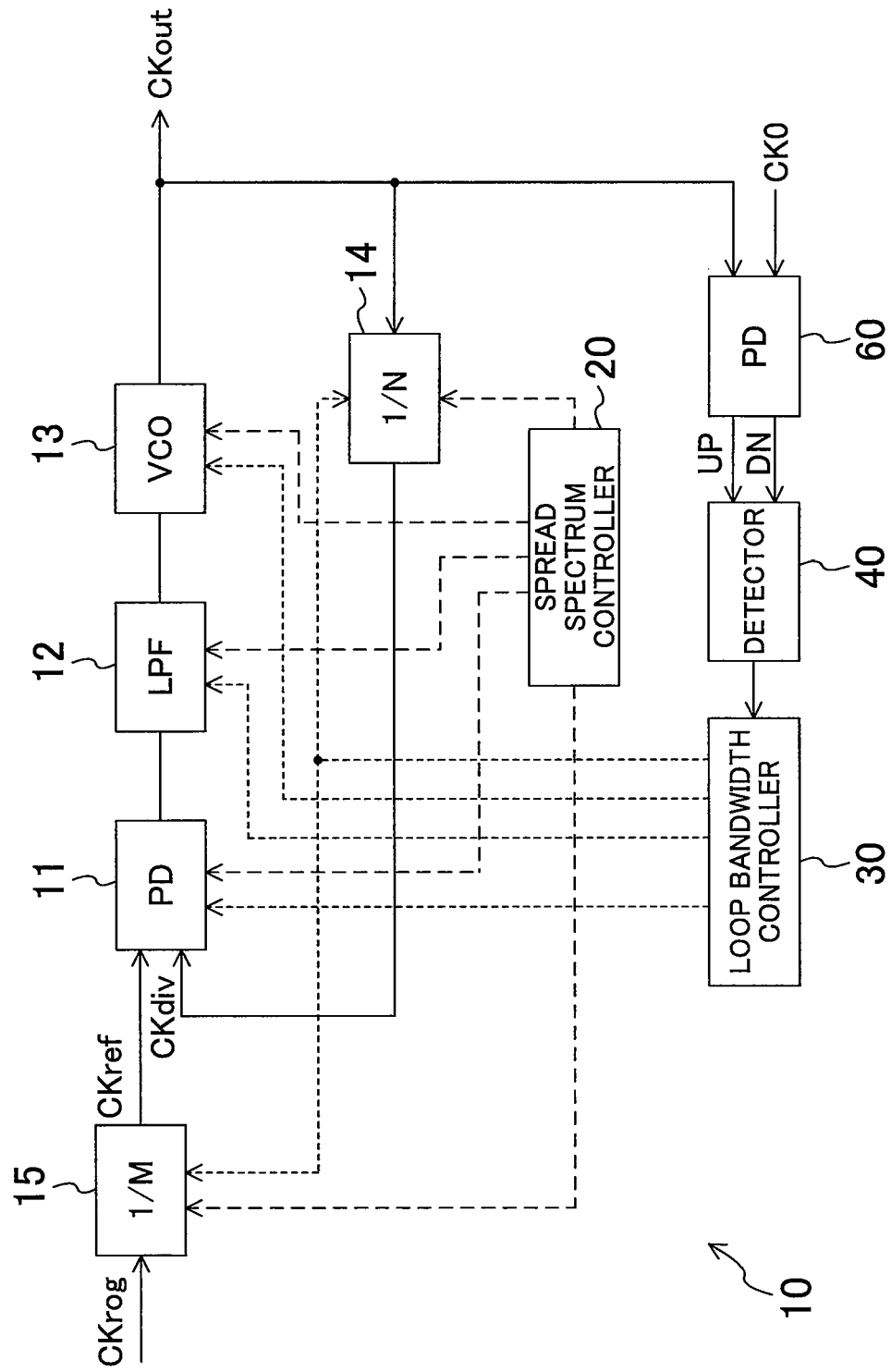
FIG. 15 is a block diagram of a spread-spectrum clock generator according to a fourth embodiment.

FIG. 15 illustrates a configuration of a spread-spectrum clock generator according to a fourth embodiment. The generator according to this embodiment further includes a phase detector (PD) 60 in addition to the generator according to the second embodiment. Only differences from the second embodiment will be described below.

The phase detector (PD) 60 compares phases of the clock signal CKout output from the PLL 10, and a clock signal CK0. Specifically, the clock signal CK0 is a clock signal having an average frequency of the clock signal CKout. When the phase of the clock signal CKout leads the phase of the clock signal CK0, the PD 60 outputs an signal UP. For example, the signal UP is set to be a given logic level (e.g., "H") from a rising edge of the clock signal CKout to a rising edge of the clock signal CK0. On the other hand, when the phase of the clock signal CK0 leads the phase of the clock signal CKout, the PD 60 outputs a signal DN. For example, the signal DN is set to be a given logic level (e.g., "L") from a rising edge of the clock signal CK0 to a rising edge of the clock signal CKout.

The detector 40 detects contents of the control on the PLL 10 in the spread spectrum modulation based on a comparison result obtained by the PD 60. For example, it can be detected that the clock signal CKout output from the PLL 10 is spread spectrum modulated when the signals UP and DN are alternately output in a cycle, and that no spread spectrum modulation is performed when they are not output alternately. Moreover, the modulation frequency in the spread spectrum modulation can be detected from a switching cycle of the outputs of the signals UP and DN. Moreover, the modulation width in the spread spectrum modulation can be detected from the maximum pulse width of the signal UP or DN, i.e., the maximum phase difference between the clock signal CKout and the clock signal CK0.

The loop bandwidth controller 30 changes the loop bandwidth of the PLL 10 based on the detection result of the detector 40. Note that the control target of the loop bandwidth controller 30 and the control examples are as described above.

As described above, according to this embodiment, the contents of the spread spectrum modulation can be detected from the output of the PLL 10 to generate the spread-spectrum processed clock signal CKout having low jitter, low noise, and a low peak in accordance with the contents. Instead of the clock signal CKout, the clock signal CKdiv output from the frequency divider 14 may be input to the PD60. In this case, the clock signal CK0 needs to be set to have an average frequency of the clock signal CKdiv.

Fifth Embodiment

Figure 16:
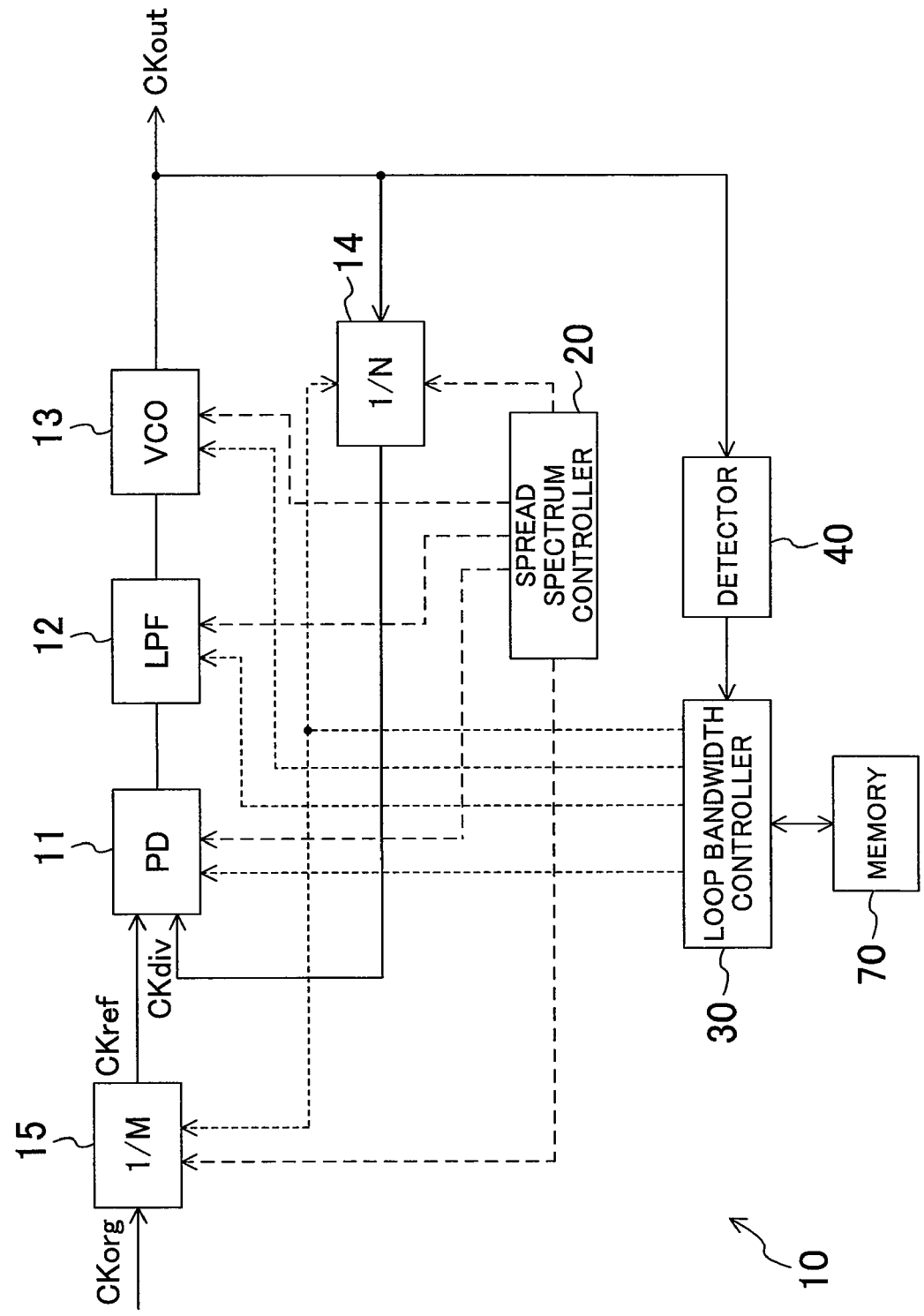
FIG. 16 is a block diagram of a spread-spectrum clock generator according to a fifth embodiment.

FIG. 16 illustrates a configuration of a spread-spectrum clock generator according to a fifth embodiment. The generator according to this embodiment further includes a memory 70 in addition to the generator according to the second embodiment. The memory 70 stores the detection result of the detector 40, or control values for the elements of the PLL 10. Only differences from the second embodiment will be described below.

Storing Example of Detection Result

The loop bandwidth controller 30 stores the detection result of the detector 40 in the memory 70. The loop bandwidth controller 30 reads the detection result of the detector 40 from the memory 70 to change the loop bandwidth of the PLL 10 based on the detection result. For example, before shipping the generator, or in initial operation before starting a system operating in response to a clock signal supplied from the generator; the controller changes the loop bandwidth of the PLL 10 to store in the memory 70 in the form of a look-up table; the loop bandwidth at this time, and at least one of the results detected by the detector 40 with respect to the peak level, the jitter, the noise level, and the frequency change rate of the clock signal CKout, whether or not the clock signal CKout is spread spectrum modulated, and the modulation frequency and the modulation width in the spread spectrum modulation. After shipping the generator, or when starting the system; the controller reads from the memory 70, a loop bandwidth which provides at least one of a desired peak level, jitter, noise level and frequency change rate; a desired determination of whether or not the clock signal CKout is to be spread spectrum modulated; and a desired modulation frequency and modulation width in the spread spectrum modulation. Then, the controller sets the loop bandwidth of the PLL 10 to the read value.

Storing Example of Control Value

The loop bandwidth controller 30 stores in the memory 70, a control value for a control target out of the PD 11, the LPF 12, the VCO 13, and the frequency divider 14 to control the target with the control value. For example, before shipping the generator or in initial operation, the controller accordingly changes the loop bandwidth so that at least one of the peak level, the jitter, the noise level, and the frequency change rate of the clock signal CKout output from the PLL 10; whether or not the clock signal CKout is spread spectrum modulated; and the modulation frequency and the modulation width in the spread spectrum modulation is at a desired value. Then, the controller stores the control value of the control target in the memory 70, when the parameter(s) is/are the desired value(s). After shipping the generator, or when starting the system, the controller reads the control value from the memory 70 to control at least one of the PD 11, the LPF 12, the VCO 13, and the frequency divider 14 with the read control value.

As described above, according to this embodiment, after starting the spread-spectrum clock generator, the detection by the detector 40 may be omitted to set the loop bandwidth of the PLL 10 to a desired value. That is, the loop bandwidth of the PLL 10 can be set to a desired value in a shorter time. Note that the memory 70 may be provided in an outer peripheral device apart from the spread-spectrum clock generator.

INDUSTRIAL APPLICABILITY

A spread-spectrum clock generator according to the present invention generates a spread-spectrum processed clock signal with excellent jitter and noise properties, and is therefore, useful for a system which requires reduction in EMI.

The invention claimed is:

1. A spread-spectrum clock generator comprising:
a PLL;
a spread spectrum controller controlling the PLL so that the PLL outputs a spread-spectrum processed clock signal; and
a loop bandwidth controller changing a loop bandwidth of the PLL during operation of the spread spectrum controller;
wherein the PLL includes:
a voltage-controlled oscillator oscillating at a frequency according to an input voltage,
a frequency divider dividing a frequency of an output of the voltage-controlled oscillator,
a phase detector comparing phases of a reference clock signal and an output of the frequency divider, and
a loop filter smoothing an output of the phase detector, and outputting a voltage for controlling the voltage-controlled oscillator, and
the loop bandwidth controller controls at least one of the phase detector, the loop filter, the voltage-controlled oscillator, and the frequency divider to change the loop bandwidth of the PPL, and
wherein
the PLL further includes a second frequency divider dividing a frequency of an original clock signal to generate the reference clock signal, and
the loop bandwidth controller also controls the second frequency divider when controlling the frequency divider.

2. A spread-spectrum clock generator comprising:
a PPL;

a spread spectrum controller controlling the PLL so that the PLL outputs a spread-spectrum processed clock signal;

a loop bandwidth controller changing a loop bandwidth of the PLL during operation of the spread-spectrum controller; and a detector detecting at least one of a peak level, jitter, a noise level, and a frequency change rate of a clock signal output from the PLL; whether or not the clock signal is spread spectrum modulated; and a modulation frequency and a modulation width in the spread spectrum modulation, wherein the loop bandwidth controller changes the loop bandwidth of the PLL based on a detection result of the detector.

3. The spread-spectrum clock generator of claim 2, wherein the loop bandwidth controller stores in a memory, a loop bandwidth at the time when the loop bandwidth of the PLL is set to a given value, and the detection result obtained by the detector in association with each other; and reads from the memory, a loop bandwidth of the PLL corresponding to at least one of desired values of the peak level, the jitter, the noise level, and the frequency change rate of the clock signal output from the PLL; whether or not the clock signal is spread spectrum modulated, and the modulation frequency and the modulation width in the spread spectrum modulation; and changes the loop bandwidth of the PLL to become the read loop bandwidth.

4. The spread-spectrum clock generator of claim 2, wherein the loop bandwidth controller stores in a memory, a control value for a control target at the time when the detection result obtained by the detector is at a desired value; and changes the loop bandwidth of the PLL with a control value read from the memory.

5. A spread-spectrum clock generator comprising:

a PLL;

a spread spectrum controller controlling the PLL so that the PLL outputs a spread-spectrum processed clock signal; and a loop bandwidth controller changing a loop bandwidth of the PLL during operation of the spread spectrum controller;

wherein the PLL includes:
   a voltage-controlled oscillator oscillating at a frequency according to an input voltage,
   a frequency divider dividing a frequency of an output of the voltage-controlled oscillator,
   a phase detector comparing phases of a reference clock signal and an output of the frequency divider, and
   a loop filter smoothing an output of the phase detector, and outputting a voltage for controlling the voltage-controlled oscillator, and the loop bandwidth controller controls at least one of the phase detector, the loop filter, the voltage-controlled oscillator, and the frequency divider to change the loop bandwidth of the PLL, and
   wherein the spread-spectrum clock generator further comprises:

a comparator comparing a reference voltage, and a control voltage for the voltage-controlled oscillator generated by modulating an output of the loop filter with the spread spectrum controller; and a detector detecting at least one of whether or not a clock signal output from the PLL is spread spectrum modulated, and a modulation frequency and a modulation width in the spread spectrum modulation based on a comparison result obtained by the comparator, wherein the loop bandwidth controller changes the loop bandwidth of the PLL based on a detection result of the detector.

6. A spread-spectrum clock generator comprising:

a PLL;

a spread spectrum controller controlling the PLL so that the PLL outputs a spread-spectrum processed clock signal; and a loop bandwidth controller changing a loop bandwidth of the PLL during operation of the spread spectrum controller;

wherein the PLL includes:
   a voltage-controlled oscillator oscillating at a frequency according to an input voltage,
   a frequency divider dividing a frequency of an output of the voltage-controlled oscillator,
   a phase detector comparing phases of a reference clock signal and an output of the frequency divider, and
   a loop filter smoothing an output of the phase detector, and outputting a voltage for controlling the voltage-controlled oscillator, and the loop bandwidth controller controls at least one of the phase detector, the loop filter, the voltage-controlled oscillator, and the frequency divider to change the loop bandwidth of the PPL, and wherein the spread-spectrum clock generator further comprises: p1 a second phase detector comparing phases of a second reference clock signal, and one of a clock signal output from the PLL and a clock signal output from the frequency divider; and a detector detecting at least one of whether or not a clock signal output from the PLL is spread spectrum modulated, and the modulation frequency and the modulation width in the spread spectrum modulation based on a comparison result obtained by the second phase detector, wherein the loop bandwidth controller changes the loop bandwidth of the PLL based on a detection result of the detector.

7. A spread-spectrum clock generator comprising:

a PLL;

a spread spectrum controller controlling the PLL so that the PLL outputs a spread-spectrum processed clock signal; and a loop bandwidth controller changing a loop bandwidth of the PLL during operation of the spread spectrum controller;

wherein the PLL includes:
   a voltage controlled oscillator oscillating at a frequency according to an input voltage,
   a frequency divider dividing a frequency of an output of the voltage-controlled oscillator,
   a phase detector comparing phases of a reference clock signal and an output of the frequency divider, and
   a loop filter smoothing an output of the phase detector, and outputting a voltage for controlling the voltage-controlled oscillator, and the loop bandwidth controller controls at least one of the phase detector, the loop filter, the voltage-controlled oscillator, and the frequency divider to change the loop bandwidth of the PLL, and the phase detector selectively outputs one of a source current and a sink current, or one of a source voltage and a sink voltage based on a phase comparison result between the reference clock signal and the clock signal output from the frequency divider, and the loop bandwidth controller changes amounts of the source current and the sink current, or magnitudes of the source voltage and the sink voltage.

8. A spread-spectrum clock generator comprising:
a PLL;
a spread spectrum controller controlling the PLL so that the PLL outputs a spread-spectrum processed clock signal; and
a loop bandwidth controller changing a loop bandwidth of the PLL during operation of the spread spectrum controller;
wherein the PLL includes:
  a voltage-controlled oscillator oscillating at a frequency according to an input voltage,
  a frequency divider dividing a frequency of an output of the voltage-controlled oscillator,
  a phase detector comparing phases of a reference clock signal and an output of the frequency divider, and
  a loop filter smoothing an output of the phase detector, and outputting a voltage for controlling the voltage-controlled oscillator, and
the loop bandwidth controller controls at least one of the phase detector, the loop filter, the voltage-controlled oscillator, and the frequency divider to change the loop bandwidth of the PLL, and
wherein
the voltage-controlled oscillator includes:
  a VI conversion circuit generating a current having an amount according to the input voltage, and
  a ring oscillator oscillating at a frequency according to the generated current, and the loop bandwidth controller changes voltage current conversion gain of the VI conversion circuit.

9. The spread-spectrum clock generator comprising:
a PLL;
a spread spectrum controller controlling the PLL so that the PLL outputs a spread-spectrum processed clock signal; and
a loop bandwidth controller changing a loop bandwidth of the PLL during operation of the spread spectrum controller;
wherein the PLL includes:
  a voltage-controlled oscillator oscillating at a frequency according to an input voltage,
  a frequency divider dividing a frequency of an output of the voltage-controlled oacillator,
  a phase detector comparing phases of a reference clock signal and an output of the frequency divider, and
  a loop filter smoothing an output of the phase detector, and outputting a voltage for controlling the voltage-controlled oacillator, and
the loop bandwidth controller controls at least one of the phase detector, the loop filter, the voltage-controlled oscillator, and the frequency divider to change the loop bandwidth of the PLL, and
wherein
the voltage-controlled oscillator includes:
  an inductor circuit including at least one inductor element, and
  a capacitance circuit connected to the inductor circuit, and including at least one capacitance element, and
the loop bandwidth controller changes at least one of a connection state of the inductor element in the inductor circuit, and a connection state of the capacitance element in the capacitance circuit.

10. A spread-spectrum clock generator comprising:
a PLL;
a spread spectrum controller controlling the PLL so that the PLL outputs a spread-spectrum processes clock signal; and
a loop bandwidth controller changing a loop bandwidth of the PLL during operation of the spread spectrum controller;
wherein the PLL includes:
  a voltage-controlled oscillator oscillating at a frequency according to an input voltage,
  a frequency divider dividing a frequency of an output of the voltage-controlled oscillator,
  a phase detector comparing phases of a reference clock signal and an output of the frequency divider, and
  a loop filter smoothing an output of the phase detector, and outputting a voltage for controlling the voltage-controlled oscillator, and
the loop bandwidth controller controls at least one of the phase detector, the loop filter, the voltage-controlled oacillator, and the frequecy divider to change the loop bandwidth of the PLL, and
wherein
the frequency divider is a variable frequency divider, and
the loop bandwidth controller changes a dividing ratio of the frequency divider.

11. The spread-spectrum clock generator of claim 1, wherein
the frequency divider and the second frequency divider are variable frequency dividers, and
the loop bandwidth controller changes dividing ratios of the frequency divider and the second frequency divider at a same rate.

* * * * *